(12) United States Patent
Pohl et al.

(10) Patent No.: US 11,754,452 B2
(45) Date of Patent: Sep. 12, 2023

(54) RESONATING SENSOR FOR HIGH-PRESSURE AND HIGH-TEMPERATURE ENVIRONMENTS

(71) Applicant: SCHLUMBERGER TECHNOLOGY CORPORATION, Sugar Land, TX (US)

(72) Inventors: Didier Pohl, Paris (FR); Florian Risser, Elancourt (FR); Jacques Sellin, Cestas (FR); Patrice Ligneul, Chaville (FR); Kamran Danaie, Clamart (FR); Mihir Patel, Hopkinton, MA (US); Boris Valkov, Clamart (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 938 days.

(21) Appl. No.: 16/544,595

(22) Filed: Aug. 19, 2019

(65) Prior Publication Data

US 2020/0056948 A1   Feb. 20, 2020

Related U.S. Application Data

(60) Provisional application No. 62/719,421, filed on Aug. 17, 2018.

(51) Int. Cl.
*G01L 1/16* (2006.01)
*G01L 9/00* (2006.01)
(Continued)

(52) U.S. Cl.
CPC ............ *G01L 1/162* (2013.01); *G01L 9/0022* (2013.01); *G01L 9/0025* (2013.01); *H03H 9/21* (2013.01); *H03H 9/215* (2013.01)

(58) Field of Classification Search
CPC ........ H03H 9/215; H03H 9/21; G01L 9/0022; G01L 1/162
See application file for complete search history.

(56) References Cited

U.S. PATENT DOCUMENTS

| 3,238,789 A | 3/1966 | Erdley |
| 3,969,640 A | 7/1976 | Staudte |
| (Continued) | | |

FOREIGN PATENT DOCUMENTS

| EP | 193070 A2 | 9/1986 |
| EP | 2607906 A1 | 6/2013 |
| (Continued) | | |

OTHER PUBLICATIONS

Cheng, R. et al., "Design and fabrication of a resonant pressure sensor by combination of DETF quartz resonator and silicon diaphragm", Microsystem Technologies, 2015, 21, pp. 631-640.
(Continued)

*Primary Examiner* — Paul M. West
(74) *Attorney, Agent, or Firm* — Jeffrey D. Frantz

(57) ABSTRACT

Resonating sensors for use in high-pressure and high-temperature environments are provided. In one embodiment, an apparatus includes a sensor with a double-ended tuning fork piezoelectric resonator that includes a first tine and a second tine. These tines are spaced apart from one another so as to form a slot between the first and second tines. The width of the slot from the first tine to the second tine varies along the lengths of the first and second tines. Various other resonators, devices, systems, and methods are also disclosed.

16 Claims, 9 Drawing Sheets

(51) Int. Cl.
*H03H 9/21* (2006.01)
*H03H 9/215* (2006.01)

(56) References Cited

U.S. PATENT DOCUMENTS

| | | | |
|---|---|---|---|
| 4,372,173 | A | 2/1983 | EerNisse et al. |
| 5,668,329 | A | 9/1997 | Petri |
| 5,844,141 | A | 12/1998 | Stansfeld |
| 6,595,054 | B2 | 7/2003 | Paros et al. |
| 7,677,105 | B2 | 3/2010 | Ishii |
| 8,955,382 | B2 | 2/2015 | Dwyer et al. |
| 2002/0152812 | A1 | 10/2002 | Featonby et al. |
| 2005/0160813 | A1* | 7/2005 | Imai ............... G01C 19/5607 73/504.12 |
| 2008/0087083 | A1 | 4/2008 | Nishizawa et al. |
| 2010/0186515 | A1* | 7/2010 | Sakurai ............... G01L 9/008 73/702 |
| 2010/0212435 | A1 | 8/2010 | Sato |
| 2011/0232387 | A1* | 9/2011 | Sakurai ............... G01L 9/0022 73/702 |
| 2014/0197898 | A1* | 7/2014 | Hsu ............... H03H 9/2463 331/155 |
| 2016/0173058 | A1 | 6/2016 | Patel et al. |
| 2017/0093361 | A1* | 3/2017 | Grosjean ............... H03H 9/17 |

FOREIGN PATENT DOCUMENTS

| | | | |
|---|---|---|---|
| WO | WO-8403998 A | * 10/1984 | ............. G01L 1/162 |
| WO | 2007085934 A1 | 8/2007 | |

OTHER PUBLICATIONS

Cheng, R. et al., "Feasibility study of a Pressure Sensor Based on Double-Ended Tuning Fork Quartz", presented at the 9th IEEE International Conference on Nano/Micro Engineered and Molecular Systems, 2014, pp. 354-357.

Chuang, S. S., "Force Sensor Using Double-Ended Tuning Fork Quartz Crystals," Proceeding of th 37th Annual Symposium on Frequency Control, 1983, pp. 248-254.

Wang, J. et al., "A Micromachined Resonant Pressure Sensor with DETFs Resonator and Differential Structure", Sensors 2009, Christchurch, New Zealand, pp. 1321-1324.

Welham, C. J. et al., "A high accuracy resonant pressure sensor by fusion bonding and trench etching", Sensors and Actuators A, 1999, 76(1), pp. 298-304.

Examination Report issued in GB application Serial No. GB1911880. 1, dated Nov. 27, 2020, 3 pages.

Combined Search and Examination Report for corresponding EP Serial No. GB1911880.1, dated Dec. 23, 2019, 7 pages.

\* cited by examiner

RESONATING SENSOR FOR HIGH-PRESSURE AND HIGH-TEMPERATURE ENVIRONMENTS

CROSS-REFERENCE TO RELATED APPLICATIONS

Any and all applications for which a foreign or domestic priority claim is identified in the Application Data Sheet as filed with the present application are hereby incorporated be reference under 37 CFR 1.57. The present application claims priority benefit of U.S. Provisional Application No. 62/719,421, filed Aug. 17, 2018, the entirety of which is incorporated by reference herein and should be considered part of this specification.

BACKGROUND

Wells are generally drilled into subsurface rocks to access fluids, such as hydrocarbons, stored in subterranean formations. The subterranean fluids can be produced from these wells through known techniques. Various equipment can be used to complete such wells and facilitate production. Further, sensors can be deployed in a well to measure downhole properties of interest, such as temperature and pressure.

In the oil and gas industry, these measurements may be used for numerous purposes, such as providing insight about various features of geological reservoirs during testing operations, characterizing new reservoir fluid mobility, monitoring reservoir depletion resulting from production of reservoir fluids, and assessing fluid density by gravity effects, to name just several examples. Sensors for acquiring these measurements can be provided in a downhole completion or a downhole tool, and may also or instead be provided outside of a well to provide measurements at other locations.

SUMMARY

Certain aspects of some embodiments disclosed herein are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present disclosure, an apparatus includes a sensor with a sensing element that has a double-ended tuning fork piezoelectric resonator. This resonator includes two tines spaced apart from one another to form a slot between the tines, and the width of the slot between the tines varies along the lengths of the tines.

In an additional embodiment, an apparatus includes a sensing element having two piezoelectric resonators. The first piezoelectric resonator is formed in a crystal substrate and includes a double-ended tuning fork within an aperture of the crystal substrate. The second piezoelectric resonator is also formed in the crystal substrate and includes a beam in the crystal substrate defined by the aperture and a slot spaced apart from the aperture. The second piezoelectric resonator includes electrodes on sides of the beam, along the slot and along the aperture, for exciting a standing wave in the second piezoelectric resonator.

In another embodiment of the present disclosure, a method includes measuring pressure of a fluid using a double-ended tuning fork resonator of a sensor in which the double-ended tuning fork has non-parallel tines. The method also includes measuring temperature of the fluid with the sensor and using the measured temperature to perform temperature compensation on the measured pressure.

Various refinements of the features noted above may exist in relation to various aspects of the present embodiments. Further features may also be incorporated in these various aspects as well. These refinements and additional features may exist individually or in any combination. For instance, various features discussed below in relation to the illustrated embodiments may be incorporated into any of the above-described aspects of the present disclosure alone or in any combination. Again, the brief summary presented above is intended just to familiarize the reader with certain aspects and contexts of some embodiments without limitation to the claimed subject matter.

BRIEF DESCRIPTION OF THE DRAWINGS

These and other features, aspects, and advantages of certain embodiments will become better understood when the following detailed description is read with reference to the accompanying drawings in which like characters represent like parts throughout the drawings, wherein.

DETAILED DESCRIPTION OF SPECIFIC EMBODIMENTS

It is to be understood that the present disclosure provides many different embodiments, or examples, for implementing different features of various embodiments. Specific examples of components and arrangements are described below for purposes of explanation and to simplify the present disclosure. These are, of course, merely examples and are not intended to be limiting.

When introducing elements of various embodiments, the articles "a," "an," "the," and "said" are intended to mean that there are one or more of the elements. The terms "comprising," "including," and "having" are intended to be inclusive and mean that there may be additional elements other than the listed elements. Moreover, any use of "top," "bottom," "above," "below," other directional terms, and variations of these terms is made for convenience, but does not mandate any particular orientation of the components.

Embodiments of the present disclosure generally relate to sensors including resonators. More particularly, in at least some embodiments a pressure sensor includes a double-ended tuning fork resonator formed in a piezoelectric material, such as a piezoelectric crystal substrate. The double-ended tuning fork resonator includes tines that vibrate at a frequency that varies in response to applied forces. For example, external pressure on the body of the sensor can induce mechanical stresses in the material of the body, which are transmitted to the tines. The tines can be parallel to one another, although in other instances non-parallel tines are used. Whether provided as a double-ended tuning fork or in some other form, the resonator can be manufactured in any suitable material. But in some embodiments the sensor includes a resonator manufactured in a material having no Curie point or a very high Curie point (i.e., of at least 1000° C.). Additionally, temperature correction may be applied to pressure measured with the resonator. In at least one embodiment, a pressure sensor includes a substrate having both the resonator for measuring pressure and an additional resonator for measuring temperature.

Figure 1:
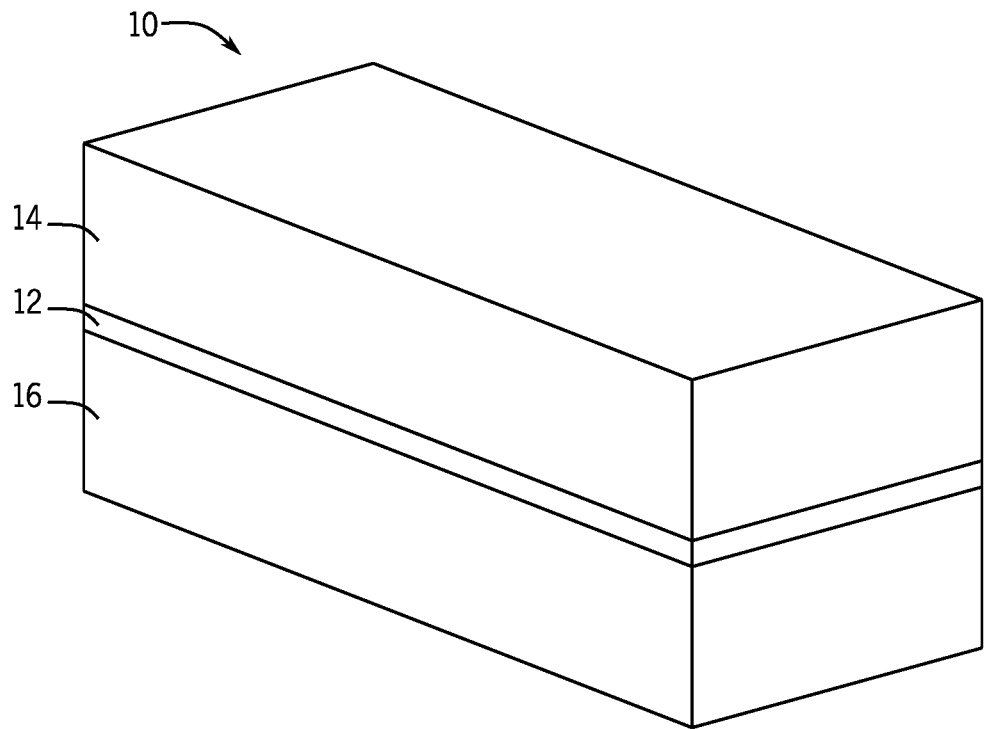
FIGS. 1-3 generally depict a sensor having a double-ended tuning fork resonator in accordance with one embodiment of the present disclosure.
Figure 2:
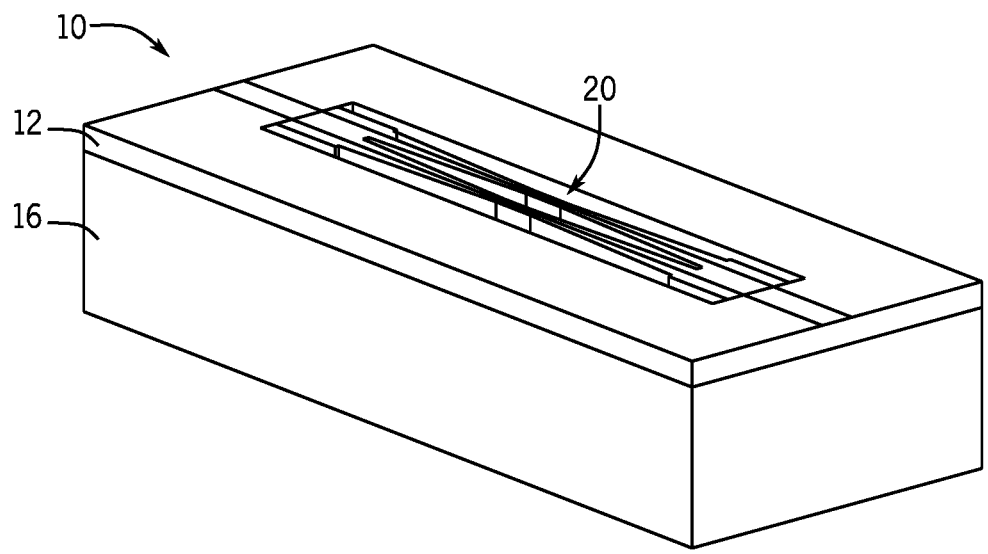
Figure 3:
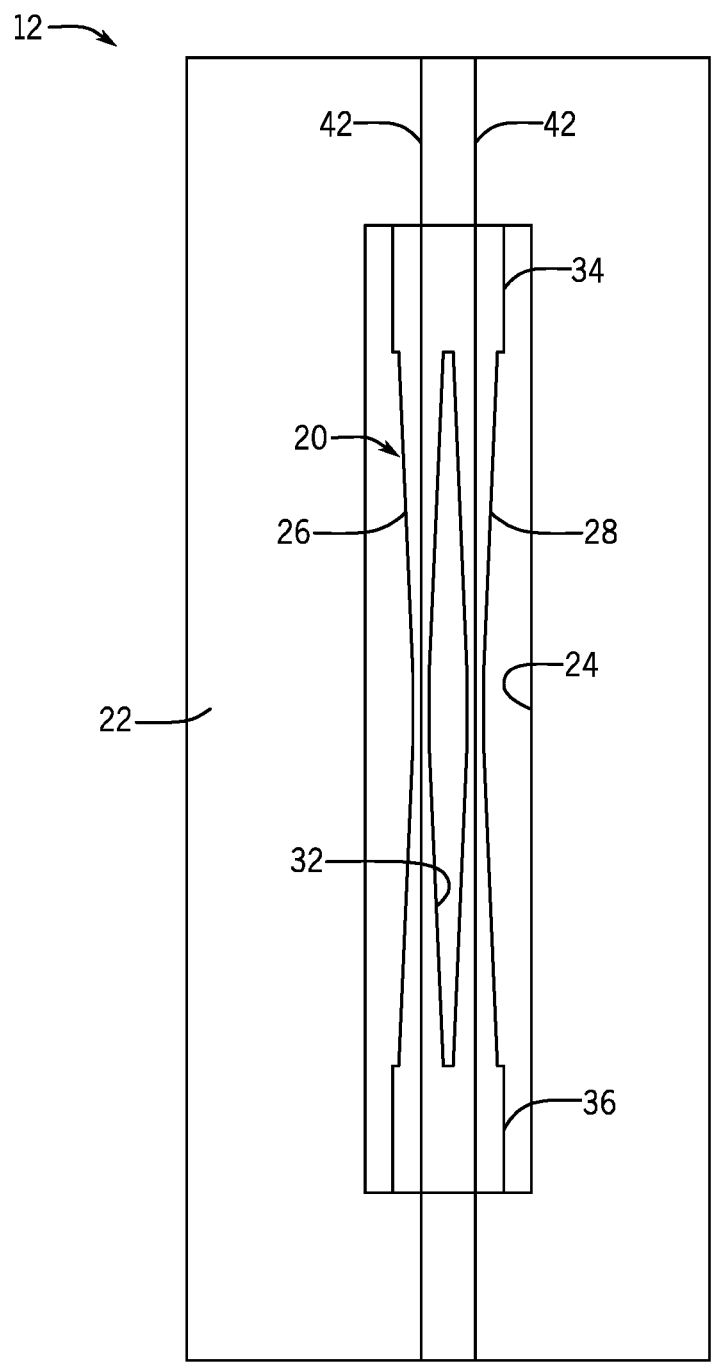

Turning now to the drawings, a sensor 10 is generally depicted in FIGS. 1-3 in accordance with one embodiment. The depicted sensor 10 includes a sensing element 12, an upper cap 14, and a lower cap 16. The sensing element 12 has a piezoelectric resonator 20 disposed within an internal cavity of the sensor 10 between the upper cap 14 and the lower cap 16. The upper cap 14 of the sensor 10 is omitted in FIG. 2 to show one example of the piezoelectric resonator 20, but it is noted that the piezoelectric resonator 20 could be provided in any other suitable form. The caps 14 and 16 can be bonded to the sensing element 12 such that the sensor 10 is hermetically sealed and the internal cavity surrounding the piezoelectric resonator 20 is isolated from the surrounding environment about the sensor 10. The internal cavity can be filled with an inert gas (e.g., nitrogen) or some other suitable medium. It can also have vacuum drawn during the sealing process in order to increase the resonator quality factor. The hermetically sealed sensor 10 can be assembled in an oil-filled surrounding in order to transfer pressure to the sensor.

A top plan view of the sensing element 12 is provided in FIG. 3, which shows the sensing element 12 as having the piezoelectric resonator 20 as a double-ended tuning fork (DETF) formed in an aperture 24 of a substrate 22. The DETF includes tines 26 and 28 separated by a medial slot 32. The tines 26 and 28, which may also be referred to as beams 26 and 28, extend lengthwise through the aperture 24 from an anchor 34 to another anchor 36. The sensing element 12 includes electrodes 42 for inducing oscillation of the tines 26 and 28. As depicted schematically in FIG. 3 for simplicity, the electrodes 42 extend longitudinally across the anchors 34 and 36 (which may also be referred to as bases) and along the lengths of the tines 26 and 28, though other arrangements could be used in different embodiments.

In at least some embodiments, the sensor 10 is a pressure sensor and the resonator 20 is a pressure-sensitive DETF resonator having in-plane and out-of-phase eigenfrequencies that vary with external pressure applied to the sensor 10. The external pressure induces mechanical stresses in the material, which are transmitted to the tines 26 and 28 through the anchors 34 and 36. A change in the stress level of the tines 26 and 28 induces a change in the eigenfrequencies of the system that can be linked to pressure through working equations.

For example, a working equation in at least some embodiments may be represented by:

$$f = f_m(1 + \alpha_{m1}\sigma + \alpha_{m2}\sigma^2 + )$$

where f is the frequency of the flexure motion, $f_m$ is the frequency of the flexure motion without external force, $\alpha_{mn}$ are the frequency pressure constants, and $\sigma$ is the external pressure.

Figure 4:
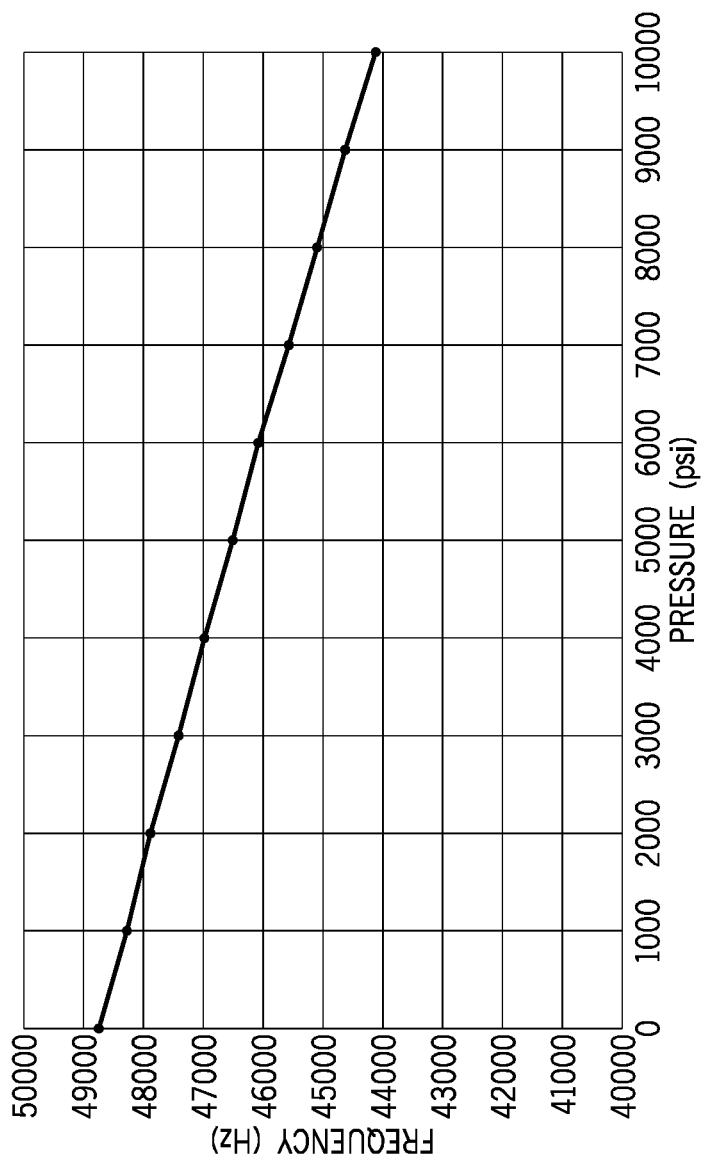
FIG. 4 graphically depicts a frequency-pressure response for the sensor of FIGS. 1-3 in accordance with one embodiment.

A numerical simulation of the system behavior with pressure and temperature variation can be used as a design tool to enhance the main performances of the resonator by extending at maximum the useful frequency range without being perturbed by spurious vibration modes. The frequency variations induced by the pressure variations can last in a full range up to 20% of the initial frequency at rest. Out of this range the risk of interaction may become much higher with the other vibrating modes of the system. Furthermore, a risk of the forks buckling can also appear beyond 20% of the initial frequency shift. The vibrating system is dimensioned numerically in various embodiments with regard to the maximum targeted pressure. For instance, FIG. 4 shows a typical frequency-pressure response optimized for 10 kPsi.

Figure 5:
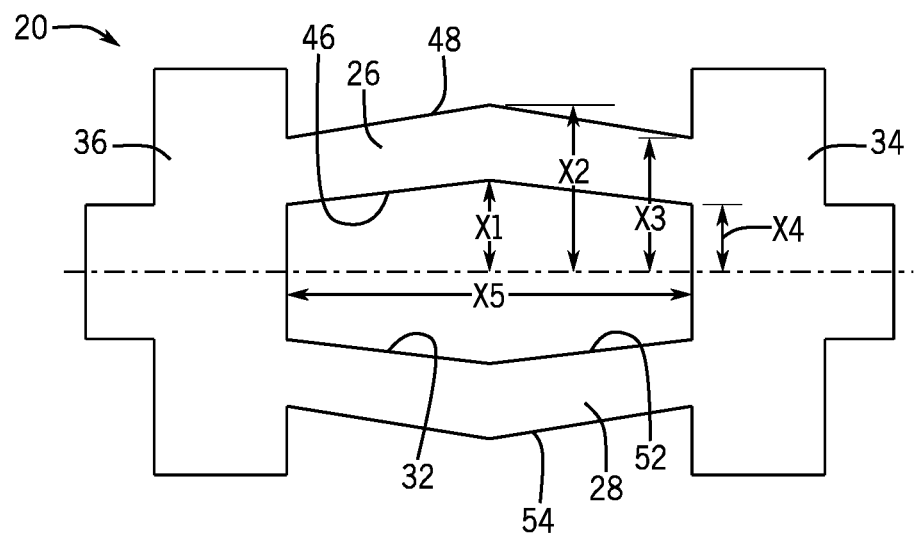
FIGS. 5 and 6 show double-ended tuning fork resonators that may be used in sensors in accordance with certain embodiments.
Figure 6:
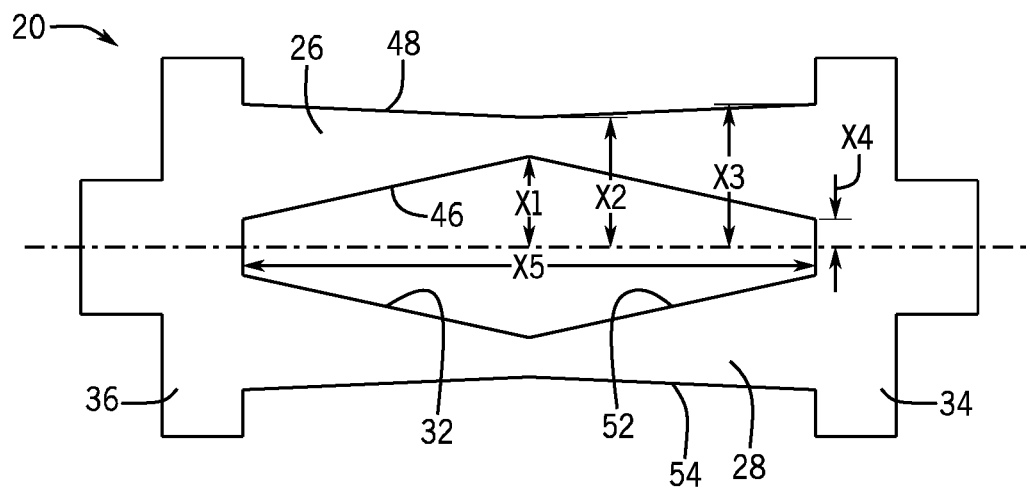

In at least some embodiments, numerical modeling of the vibrating modes of the sensor considers geometrical features depicted in FIGS. 5 and 6, which can facilitate optimization of the resonator shape in view of material properties and operating envelope. More specifically, these figures schematically depict two examples of DETF resonators 20 with five input parameters (i.e., $x_1$, $x_2$, $x_3$, $x_4$, and $x_5$) that can be independently modified to adjust the frequency of the flexural motion without external force and the frequency change when pressure is applied. As shown in FIGS. 5 and 6, $x_5$ defines the length of the tines 26 and 28 measured linearly between the anchors 34 and 36 (i.e., the distance separating the anchors 34 and 36), $x_1$ and $x_2$ define the width of the tines 26 and 28 at their centers (i.e., at their longitudinal midpoints along the length $x_5$), and $x_3$ and $x_4$ define the width of the tines 26 and 28 at their anchored extremities (i.e., at the anchors 34 and 36). In at least some embodiments, and as shown in FIG. 6, the width of the tines 26 and 28 at their anchored extremities is greater than the width of the tines 26 and 28 at their centers (i.e., $(x_3-x_4)>(x_2-x_1)$). In designing the DETF resonator 20 of some embodiments, limiting the width of the tines 26 and 28 at their centers (i.e., $x_2-x_1$) increases sensitivity of the resonator 20 to pressure, adjusting the width of the tines 26 and 28 at their anchored extremities (i.e., $x_3-x_4$) adjusts the frequency at maximum pressure, and varying the length ($x_5$) of the tines 26 and 28 changes the Q-factor of the sensor. The thickness of the substrate 22 in which the resonator 20 is formed can also be used as a sixth input parameter ($x_6$), and the thickness $x_6$ of the system can be adjusted to minimize occurrence of spurious modes (which may interact with the effective mode). These input parameters can be optimized through modeling to adapt sensor characteristics to various piezoelectric materials (including Langasite-family crystals, as described further below) and their respective cut orientation.

In at least some embodiments having DETF resonators 20, the tines 26 and 28 are symmetric. For instance, the resonators 20 depicted in FIGS. 5 and 6 have line symmetry, with tines 26 and 28 mirroring each other across an axis of symmetry represented by the dashed horizontal line in each of these figures. Each of the tines 26 and 28 in FIGS. 5 and 6 also has opposite sides that mirror each other across a second axis of symmetry through the midpoints of the tines 26 and 28 (e.g., the left side of each tine in FIGS. 5 and 6 is a mirror image of the right side of that tine). The tines 26 and 28 may also have rotational symmetry. Examples of this are also depicted in FIGS. 5 and 6, in which the arrangement of the tines 26 and 28 look the same when rotated one-hundred eighty degrees (e.g., within the plane of the page or about either axis of line symmetry noted above).

And while the tines 26 and 28 could be parallel with one another in some embodiments, the tines 26 and 28 of FIGS. 5 and 6 are not parallel with one another. In FIG. 5, for example, the tines 26 and 28 are not parallel and instead bow outward from one another such that the width of the slot 32 between the tines (measured orthogonally to the length of the tines) varies along the length of the tines. The tine 26 is shown in FIG. 5 as having an inner edge 46 and an outer edge 48, while the tine 28 is similarly shown as having an inner edge 52 and an outer edge 54. Although the tines 26 and 28 are not parallel with each other, the edges 46 and 48 on either side of the longitudinal midpoint of the tine 26 are parallel with one another in FIG. 5, as are the edges 52 and 54 on either side of the longitudinal midpoint of the tine 28. This results in tines 26 and 28 each having a constant width across their respective lengths (with these widths measured orthogonal to the lengths).

In contrast to the tines 26 and 28 in FIG. 5, the widths of the tines 26 and 28 depicted in FIG. 6 vary. More particularly, in this depicted embodiment, the outer edges 48 and 54 are inwardly tapered from the opposite ends of the tines 26 and 28 at the anchors 34 and 36 to the midpoints of the tines 26 and 28. The tines 26 and 28 are also tapered along their inner edges 46 and 52, as shown in FIG. 6. The extent to which the inner and outer edges are tapered can be defined by a taper angle, which may be represented as an angle of deviation of the edges with respect to the horizontal axis. The magnitude of the taper angle of the outer surfaces 48 and 54 is less than the taper angle of the inner surfaces 46 and 52 in FIG. 6. But in other embodiments the taper angle of the outer surfaces 48 and 54 could be greater than or equal to the taper angle of the inner surfaces 46 and 52. Still further, in embodiments with fewer degrees of symmetry, the taper angles of the inner surfaces 46 and 52 may differ from one another, as may the taper angles of the outer surfaces 48 and 54.

The resonator 20 can be formed of any suitable material. α-Quartz is a commonly used piezoelectric material for resonators. Its performance is limited at high temperature, however, which has repercussions for applications in components for high-temperature pressure sensors. Piezoelectric properties of α-Quartz are limited by its alpha-beta phase transition at 573° C. This limitation by itself may not be problematic for sensors operating at low temperatures (below 150° C., for instance), but the material used for sealing the various elements of a pressure sensor can be especially sensitive to visco-plastic deformations under stress applied on the assembly. Accordingly, in some embodiments a different material is used in manufacturing the sensing element (i.e., resonator 20), such as a piezoelectric crystal material that has a melting point above 1000° C. and does not have a Curie temperature below 1000° C. For example, in at least some embodiments, the sensing element if formed of any material from the Langasite $La_3Ga_5SiO_{14}$ (LGS) family (Langatate $La_3Ga_{5.5}Ta_{0.5}O_{14}$ (LGT), Langanite, etc.). These materials have no alpha-beta phase transitions up to their melting points, typically on the order of 1500° C. They also have very high dielectric coupling as seen in the following table:

TABLE

| Crystal properties | | |
|---|---|---|
| | Langatate (LGT) | α-Quartz |
| Formula | $La_3Ga_{5.5}Ta_{0.5}O_{14}$ | $SiO_2$ |
| Density | 6130 kg/m³ | 2648 kg/m³ |
| Curie Temperature | none | 573.3° C. |
| Melting point | 1450° C. | 1723° C. |
| Dielectric constant at 1 MHz | $\varepsilon_{33}/\varepsilon_0 = 80.3$ | $\varepsilon_{33}/\varepsilon_0 = 4.68$ |
| Thermal expansion ($10^{-6}$/K) | $\alpha_{11} = 5.05$; $\alpha_{33} = 3.12$ | $\alpha_{11} = 7.64$; $\alpha_{33} = 14.0$ |
| Piezoelectric charge coefficient ($10^{-12}$ C/N) | $d_{11} = -6.5$; $d_{14} = 4.7$ | $d_{11} = -2.3$; $d_{14} = -0.67$ |
| Piezo strain coefficient (C/m²) | $e_{11} = -0.26$; $e_{14} \approx 0.36$ | $e_{11} = 0.171$; $e_{14} = -0.0436$ |

The resonators 20 may be formed in any suitable manner, such as from crystal wafers via batch etching methods, which facilitates simultaneous production of repeatable and reproducible sensing elements for use in sensors 10. Although a double-ended tuning fork is described as an example of a resonator 20, it will be appreciated that other resonators 20 for sensors 10 can be provided in different forms, such as non-DETF resonators of any shape cut or otherwise formed in crystal wafers. And while sensors 10 can be of other types in various embodiments (e.g., temperature sensors, force sensors, accelerometers, and angular sensors), it is again noted that in some embodiments the sensor 10 is a pressure sensor.

The use of crystals from the Langasite family as resonator material facilitates higher-temperature sealing processes for assembling the sensor 10. Certain other materials (e.g., α-Quartz) have Curie temperatures below their melting points and lose their piezoelectric properties when heated above their Curie temperatures. While crystals from the Langasite family may have lower melting points than α-Quartz, these crystals can maintain their piezoelectric properties at higher temperatures. This allows the use of sealing material (e.g., devitrified glass) having better shear resistance characteristics in coupling the components of the sensor 10 together.

Figure 7:
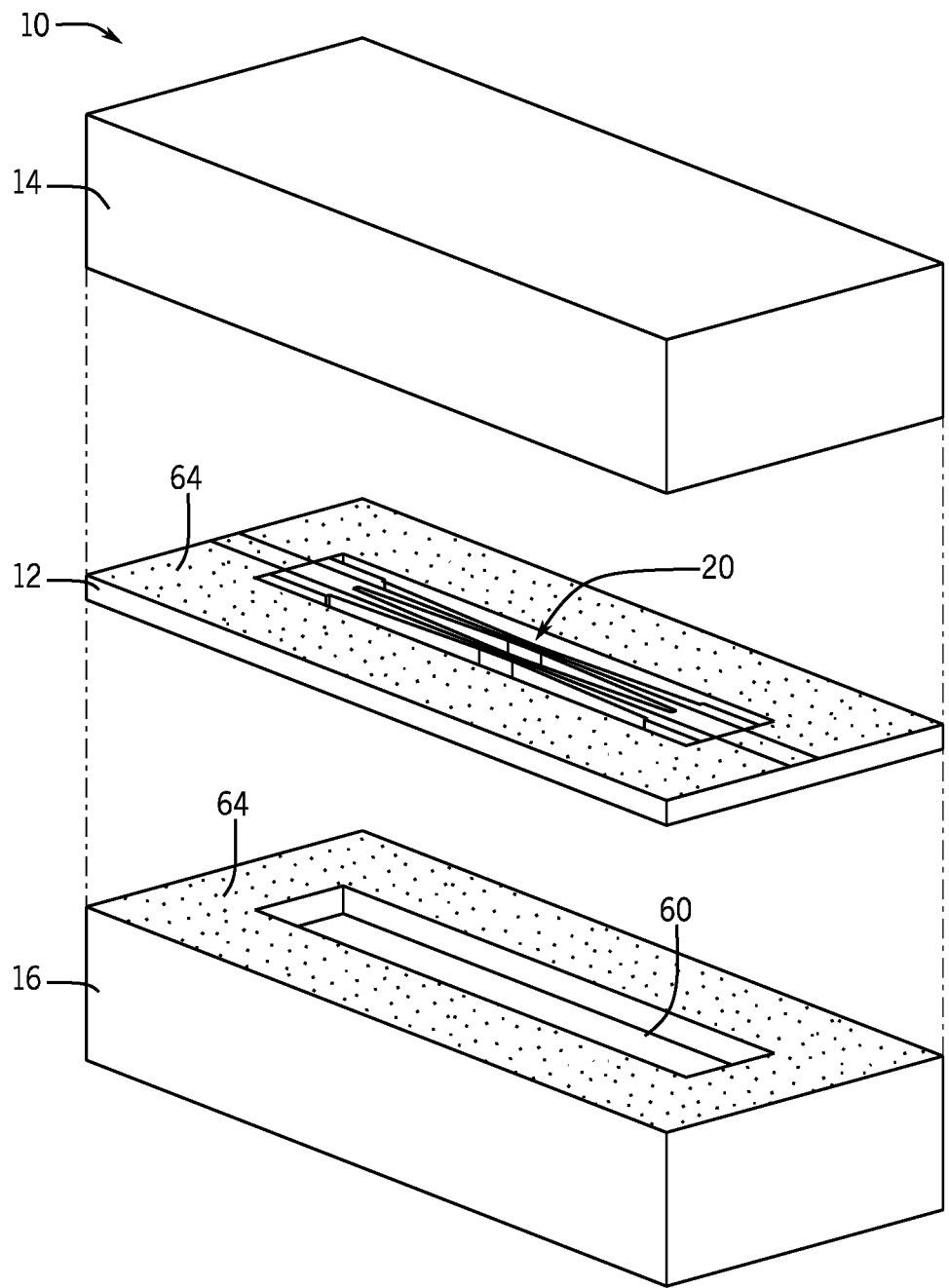
FIG. 7 is an exploded view of the sensor of FIGS. 1-3 and shows the use of a bonding agent for joining components of the sensor in accordance with one embodiment.

By way of example, an exploded view of a sensor 10 is depicted in FIG. 7. The caps 14 and 16, which may also be referred to as covers, each include a recess 60. When the sensor 10 is assembled, the caps 14 and 16 cover the resonator 20 of the sensing element 12, and the resonator 20 is positioned and allowed to oscillate between the recesses 60. The components of the sensor 10 may be joined in any suitable manner, but in at least some embodiments devitrifying glass 64 is used to assemble the sensing element 12 with both caps 14 and 16. This glass layer can be used to isolate the resonator 20 (e.g., tines 26 and 28 in DETF embodiments) from outside pressure to keep the resonator 20 vibrating under vacuum.

A glass paste or powder of devitrifying glass 64 can be deposited on abutting surfaces of the sensing element 12 and caps 14 and 16. In one such embodiment, the caps 14 and 16 and the sensing element 12 are then assembled together at room temperature and bonded (via the devitrifying glass 64) at high temperature (e.g., above the Curie temperature of α-Quartz). After bonding at high temperature, the devitrifying glass 64 can be annealed. While certain bonding materials may be annealed rapidly, such when cooled are often less able to resist shocks and vibration. In contrast, devitrifying glass may anneal more slowly to remove internal stresses and toughen the glass.

Figure 8:
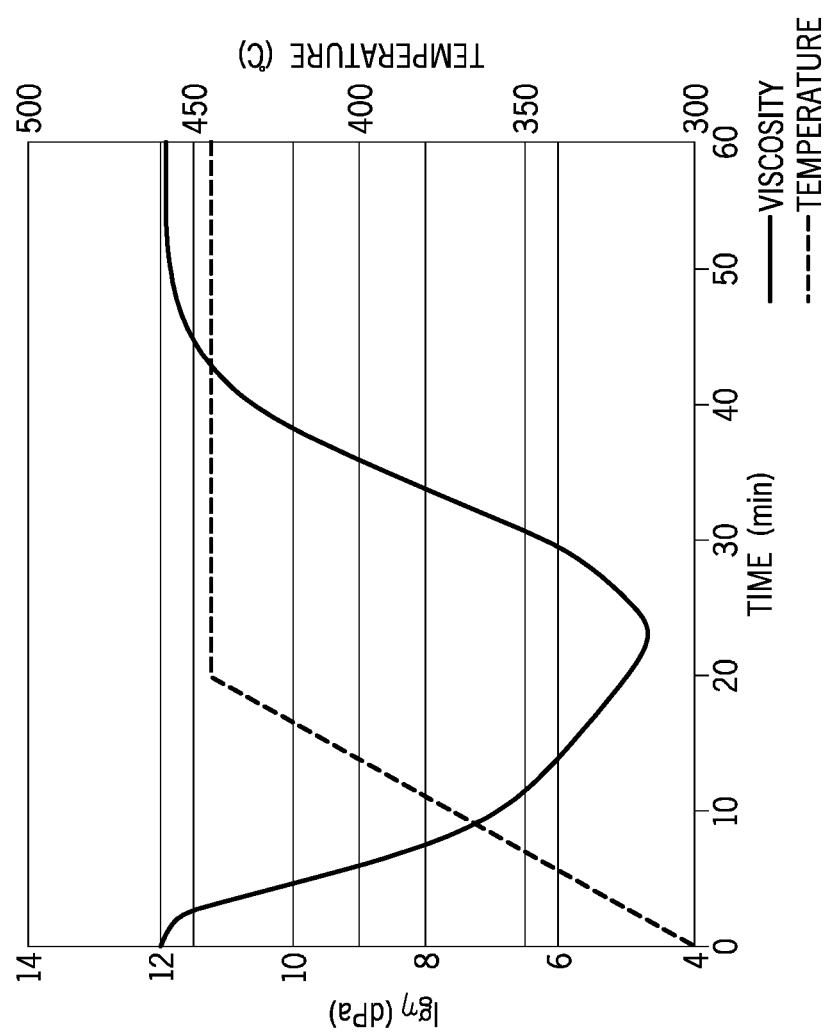
FIG. 8 graphically depicts time-dependent viscosity behavior of a devitrifying glass used as a bonding agent for joining components of the sensor during assembly in accordance with one embodiment.

Devitrifying glasses have an increased tendency to crystallize and turn into a ceramic-like polycrystalline state during glazing. The viscosity of a devitrifying glass can decrease when initially heated, which aids in flow of the glass 64 between the abutting surfaces of the sensing element 12 and the caps 14 and 16, and then increase during crystallization so that further flowing is suppressed. An example of this time-dependent viscosity behavior is shown in FIG. 8 for a devitrifying solder glass 64 processed by a specific temperature time program. In this example, glass viscosity decreases as temperature increases until crystallization begins (around minute 22 in FIG. 8). Crystallized glass may anneal more slowly than vitreous glass (due to higher viscosity) and may provide improved sensor performance in terms of aging. As used herein, the term "aging" is the systematic change in frequency with time due to internal changes in the oscillator when factors external to the oscillator (environment, power supply, etc.) are kept constant, and the term "drift" is the systematic change in frequency with time of an oscillator. Drift is due to aging plus changes in the environment and other factors external to the oscillator. In at least some embodiments, the presently described techniques may enable sensors with reduced drift and increased precision, trueness, accuracy, range, discrimination, and stability over time for downhole applications.

When an assembled pressure sensor 10 is deployed, external pressure may be directly applied to the external surfaces of the caps 14 and 16. These caps 14 and 16 are compressed under pressure, and pressure is transferred to the sensing element 12 through both caps. Although the caps 14 and 16 could be made of other materials, in some embodiments the caps 14 and 16 are made with the same piezoelectric crystal material as the sensing element 12 (e.g., Langasite-family crystals) and the same crystal orientation. This allows the thermal expansion properties of the caps 14 and 16 to match those of the sensing element 12, reducing shear stress in the bonding layer (e.g., the devitrifying glass 64 or some other bonding agent) during temperature changes.

The sensor 10 can be used in various environments, including in high-pressure, high-temperature environments. In some oilfield operations, for example, the sensor 10 may be used at temperatures of more than 250° C. and pressures up to 35-50 kPsi. And in some embodiments, such as those in which the sensor 10 is formed with Langasite-family crystal components, the sensor 10 could be used at even greater temperatures (e.g., above 500° C.) and pressures. Additionally, the use of crystals from the Langasite family or other materials having no Curie point or a very high Curie point (i.e., of at least 1000° C.) for the sensing element 12, in combination with the use of devitrifying glass 64, may allow the resulting sensor 10 to operate in higher temperatures and pressures with lower pressure drift over time compared to some other sensors (e.g., those using an α-Quartz resonator).

Because the crystal resonance of the resonator 20 can be affected by temperature variations, the temperature at which a pressure sensor 10 operates can introduce errors in the pressure measurements acquired with the sensor. Temperature compensation can be performed to reduce or eliminate these errors based on measured temperatures. Temperature measurement in the sensor 10 can be done through various methods.

Figure 9:
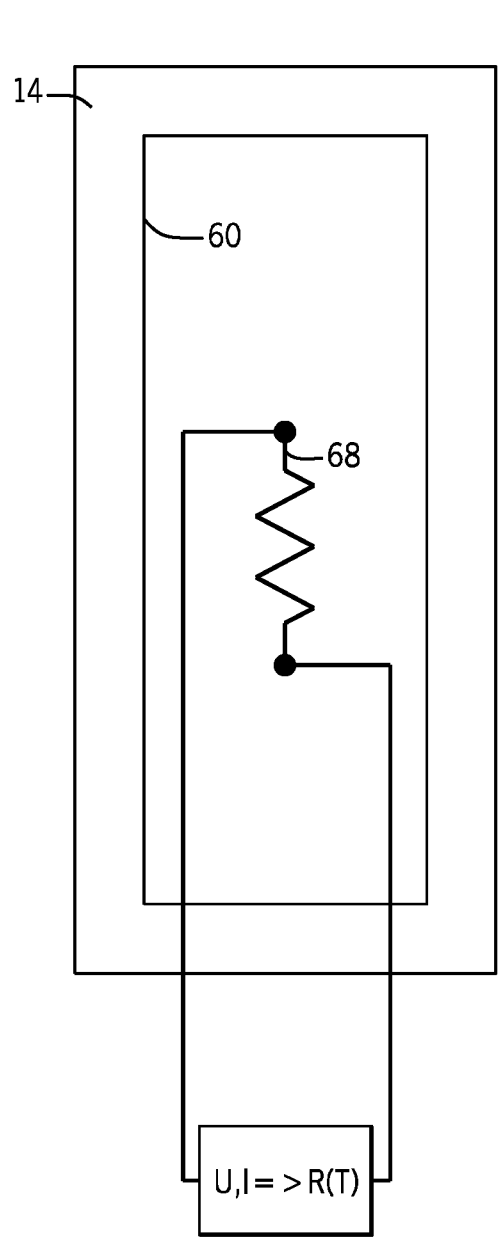
FIG. 9 schematically depicts a resistance temperature detector mounted to a cap of the sensor of FIGS. 1-3 for measuring temperature in accordance with one embodiment.
Figure 10:
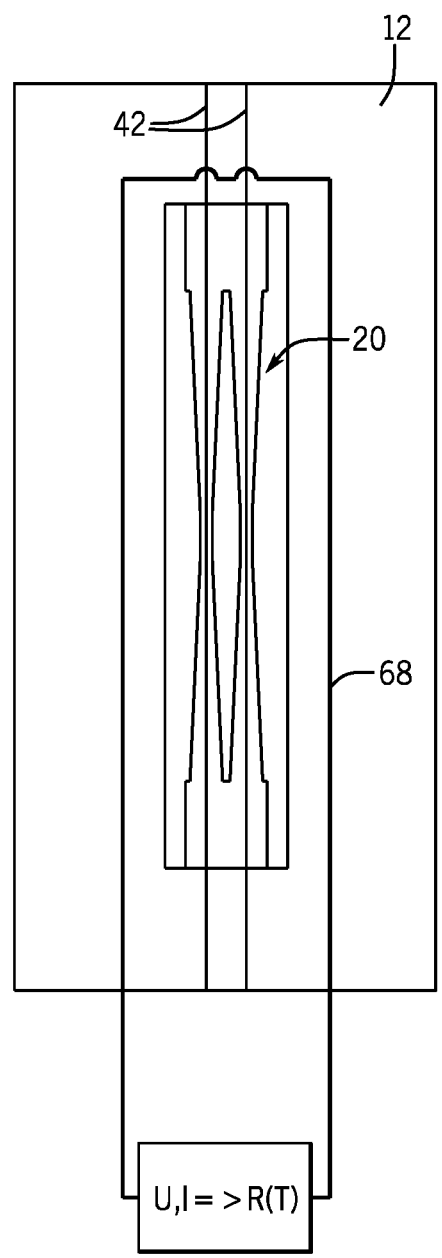
FIG. 10 depicts a resistance temperature detector provided on a sensing element substrate around a double-ended tuning fork resonator in the substrate in accordance with one embodiment.

In some embodiments, including those depicted in FIGS. 9 and 10, the temperature is determined with a resistance temperature detector 68. The resistance temperature detector 68 can include a metal wire (e.g., a platinum wire) having a resistivity that varies in a known manner with temperature, and the resistance (R) of the wire can be measured (based on voltage (U) and current (I) in accordance with Ohm's Law) and used to determine its temperature (T). The resistance temperature detector 68 can be mounted on an interior surface of cap 14 or 16 (as shown schematically in FIG. 9) or on the substrate 22 of the sensing element 12 (as generally shown in FIG. 10).

In other embodiments, the temperature can be determined in a similar manner through direct analysis of the resistivity of the excitation electrodes 42 of the sensor 10, rather than with a separate resistance temperature detector 68. In such embodiments, the dependence of the resistivity of the electrodes 42 (e.g., platinum electrodes) to temperature is known, and the resistivity of these electrodes can be estimated to determine the temperature inside the sensor 10. The resistances of electrodes 42 can be estimated in a direct current mode or in a short duty cycle at low frequency. While the electrodes 42 and a sensing wire of the resistance temperature detector 68 can be provided as platinum elements, it will be appreciated that other suitable metals or materials can be used.

Figure 11:
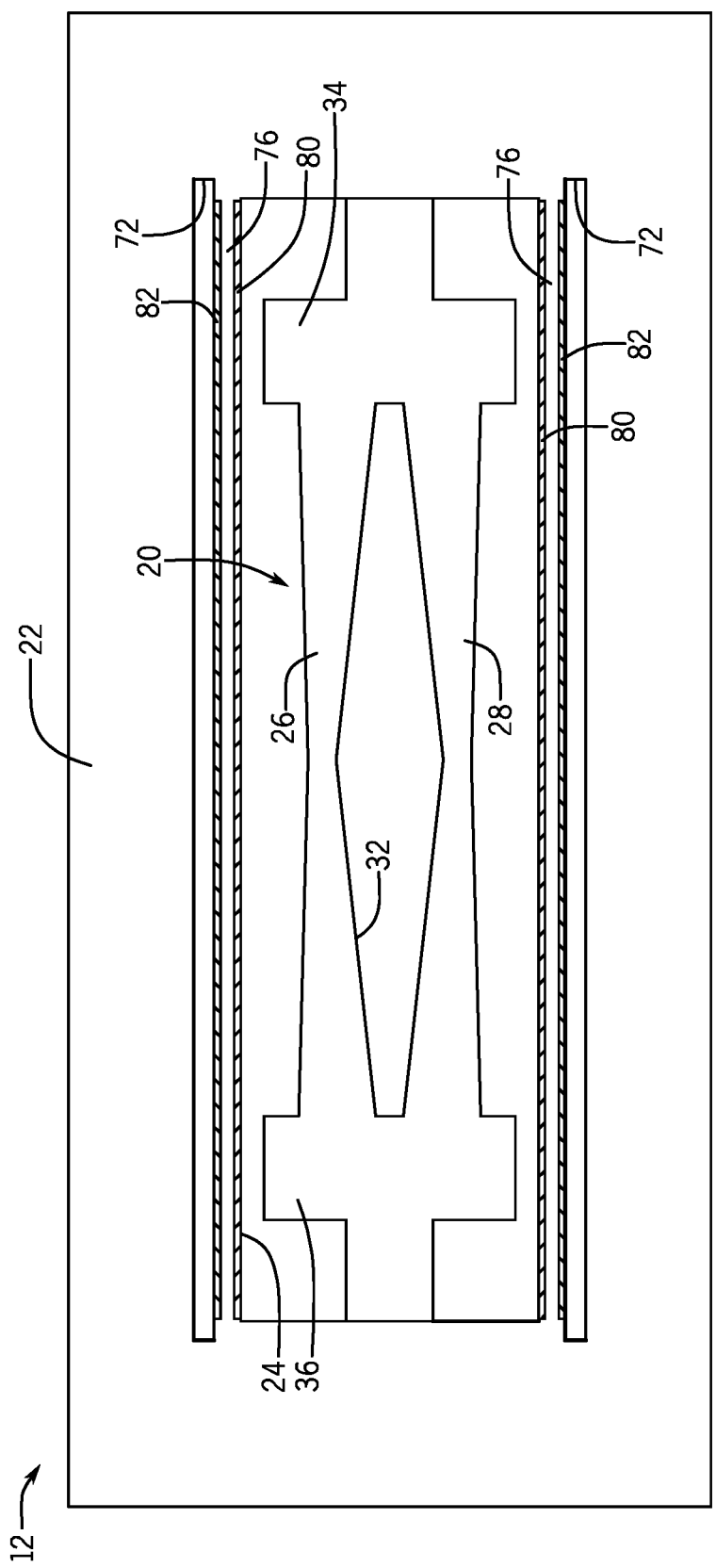
FIG. 11 depicts a sensing element of a sensor, the sensing element having a double-ended tuning fork resonator and a bulk acoustic wave resonator, in accordance with one embodiment.

Rather than using a resistive measurement, an additional resonator is used in still other embodiments to determine the temperature of the sensor 10. The use of such additional resonator may allow the use of simpler electronics for driving and acquiring the signal of the sensor 10. Although the temperature could be determined by the measurement of the resonance frequency of an additional temperature dependent resonator external to a pressure sensor 10, in certain embodiments the temperature of a pressure sensor 10 is determined by the measurement of the resonance frequency of an additional, temperature-dependent, piezoelectric resonator integrated inside the pressure sensor 10, such as a bulk acoustic wave (BAW) resonator in the sensing element structure (i.e., in the substrate 22). One example of this is depicted in FIG. 11.

In this depicted embodiment, the sensing element 12 includes not just the resonator 20, but also additional slots 72 formed in the substrate 22. These slots 72 are spaced apart from the aperture 24 to define beams 76 of an additional resonator in the substrate 22 for exciting a BAW resonance mode. The slots 72 can be formed in the substrate 22 in the same manner as the aperture 24, such as via etching, laser cutting, or some other suitable manufacturing process. This allows both resonators to be integrated together into a flat crystal resonator substrate 22. As depicted in FIG. 11, the beams 76 include opposing sides (along the aperture 24 and the slots 72) that are parallel to one another, and the tines 26 and 28 of the resonator 20 are not parallel to one another, but other embodiments may be configured differently.

In at least some instances, the resonator 20 is used to measure pressure (and may be referred to as a pressure resonator) and the additional resonator having the beams 76 is used to measure temperature (and may be referred to as a temperature resonator). In such embodiments, this additional resonator facilitates calibration or other correction of non-linearities in pressure measurements acquired by the resonator 20. Electrodes 80 and 82 can be provided, such as via deposition during manufacture, on opposing sides of the beams 76. In operation, an acoustic standing wave can be excited between the opposing sides of the beams 76. The resonance frequency of the additional resonator may be one or more orders of magnitude larger than that of the resonator 20 to limit interference between these frequencies. For instance, the additional resonator may be constructed to vibrate at a frequency that is at least two orders of magnitude greater than the frequency at which the resonator 20 is constructed to vibrate. In one further example, a resonance frequency for the additional resonator in LGT can be around 40 MHz, while the resonance frequency of a pressure resonator 20 in LGT can be around 40 kHz (differing by three orders of magnitude). In yet another embodiment, the additional resonator having beams 76 may be omitted, and the resonator 20 can be used to determine both pressure and temperature. For instance, the resonator 20 can be used in two modes to compare partials of the resonance frequency, such as the fundamental and third partial, whose difference varies linearly or in another known manner with temperature.

Figure 12:
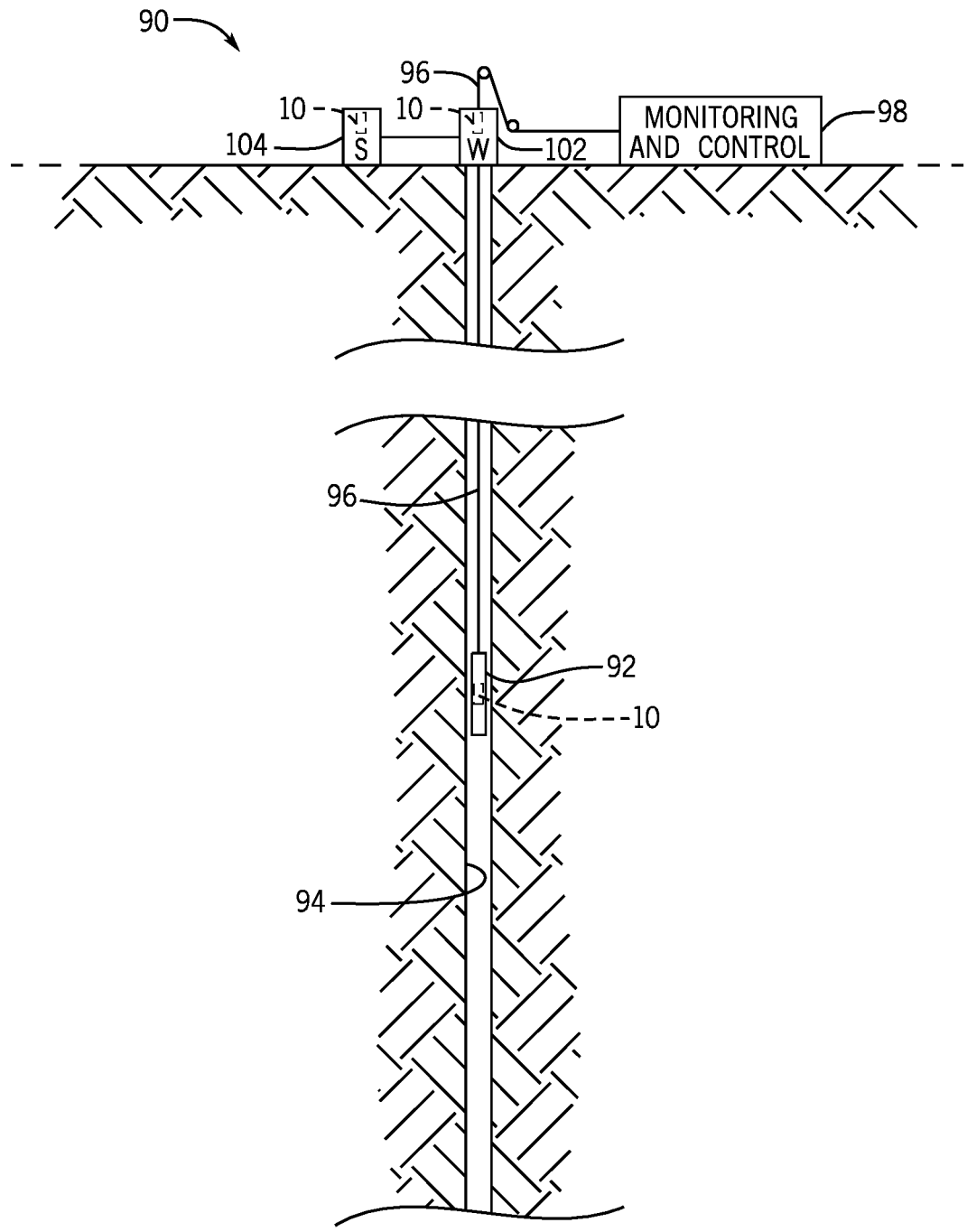
FIG. 12 generally depicts an apparatus including a downhole tool deployed within a well on a cable, with the apparatus including various sensors in accordance with one embodiment of the present disclosure.

The sensors 10 described above can be used in various applications to measure fluid parameters, such as pressure and temperature. In at least some embodiments, sensors 10 are used to measure fluid parameters in oilfield applications. By way of example, an apparatus 90 having various sensors 10 for measuring fluid parameters is depicted in FIG. 12 in accordance with one embodiment. In this depicted embodiment, a downhole tool 92 is suspended in a well 94 on a cable 96. The downhole tool 92 could be deployed in the well 94 as a single tool or as multiple tools coupled together in a tool string. The cable 96 in FIG. 12 is a wireline that enables data transmission between the downhole tool 92 and a monitoring and control system 98. In another embodiment, the cable 96 is provided in some other form, such as a slickline. The downhole tool 92 may be raised and lowered within the well 94 via the cable 96 in any suitable manner. For instance, the cable 96 can be reeled from a drum in a service truck, which may be a logging truck having the monitoring and control system 98. Although the downhole tool 92 is depicted in FIG. 12 as being deployed via a cable, the downhole tool 92 could be deployed within the well 94 in any other suitable manner, such as by coiled tubing or as part of a drill string.

The monitoring and control system 98 controls movement of the downhole tool 92 within the well 94 and receives data from the downhole tool 92. The monitoring and control system 98 can include one or more computer systems or devices that include a processor and coded application instructions in a memory for implementing the functionality described above, including pressure measurement and temperature compensation. The system 98 can receive data from the downhole tool 92, and this data can be stored, communicated to an operator, or processed. Although generally depicted in FIG. 12 at a wellsite, it is noted that the system 98 could be positioned elsewhere, and that the system 98 could be a distributed system with elements provided at different places near or remote from the well 94. For example, a local component of the system 98 may be located at the wellsite for controlling operation of the downhole tool 92 and receiving data from the tool 92, but the received data could be processed by a different portion of the system 98 at another location. In some instances, the downhole tool 92 can include a processor and instructions for locally processing data acquired via the sensor 10 within the downhole tool 92.

The downhole tool 92 can be lowered via the cable 96 into the well 94 through a wellhead assembly 102, and the apparatus 90 can include various other equipment 104 (e.g., valves, pumps, separators, pipelines, and holding tanks). The use of sensors 10 is not limited to the downhole tool 92—sensors 10 can also or instead be provided at other locations in the apparatus 90. For instance, sensors 10 can be provided at the wellhead assembly 102, in the equipment 104, or with downhole tubular strings or other completion equipment within the well 94, to measure fluid parameters at those locations.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The invention claimed is:

1. An apparatus comprising:
a sensor including a sensing element having a double-ended tuning fork piezoelectric resonator including a first tine and a second tine spaced apart from one another so as to form a slot between the first and second tines, wherein a width of the slot from the first tine to the second tine, the width of the slot measured orthogonally to a length of the first tine and a length of the second tine, varies along the lengths of the first and second tines,
wherein the sensor comprises a body comprising the sensing element and caps coupled to the sensing element so as to enclose the double-ended tuning fork piezoelectric resonator within a cavity inside the body, wherein the sensing element and the caps are hermetically sealed,
wherein the double-ended tuning fork piezoelectric resonator is formed in a substrate with the first and second tines positioned within an aperture of the substrate with the slot between the first and second tines, wherein the substrate includes an additional resonator, and
wherein the additional resonator includes: a beam in the substrate, the beam located between the aperture and an additional slot in the substrate spaced from the aperture; and two electrodes on the beam to enable excitation of an acoustic standing wave in the beam.

2. The apparatus of claim 1, wherein the first tine is symmetrical with the second tine.

3. The apparatus of claim 2, wherein opposite sides of the first tine are symmetrical with each other, and wherein opposite sides of the second tine are symmetrical with each other.

4. The apparatus of claim 3, wherein the opposite sides of the first tine are inwardly tapered toward a middle of the first tine and the opposite sides of the second tine are inwardly tapered toward a middle of the second tine.

5. The apparatus of claim 3, wherein the first and second tines are not parallel.

6. The apparatus of claim 1, wherein the first and second tines bow outward from one another.

7. The apparatus of claim 1, wherein the first and second tines are formed of a piezoelectric crystal material that has a melting point above 1000° C. and does not have a Curie temperature below 1000° C.

8. The apparatus of claim 1, wherein the sensor includes a resistance temperature detector.

9. An apparatus comprising:
a sensing element having:
- a first piezoelectric resonator formed in a crystal substrate, the first piezoelectric resonator including a double-ended tuning fork within an aperture of the crystal substrate; and
- a second piezoelectric resonator formed in the crystal substrate, wherein the second piezoelectric resonator includes: a beam in the crystal substrate defined by the aperture and a slot spaced apart from the aperture, a first electrode positioned on one side of the beam along the slot, and a second electrode positioned on another side of the beam along the aperture, wherein the first and second electrodes facilitate excitation of a standing wave in the second piezoelectric resonator.

10. The apparatus of claim 9, wherein the double-ended tuning fork includes two tines that are not parallel to one another.

11. The apparatus of claim 10, wherein the beam includes a first side defined by the aperture and a second side defined by the slot, and the first and second sides of the beam are parallel to one another.

12. The apparatus of claim 9, wherein the first piezoelectric resonator is configured to vibrate at a first frequency and the second piezoelectric resonator is configured to vibrate at a second frequency that is at least two orders of magnitude greater than the first frequency so as to limit interference between the first and second frequencies.

13. A method comprising:
- measuring pressure of a fluid using a double-ended tuning fork resonator of a sensor, the double-ended tuning fork resonator having non-parallel tines, wherein the tines are formed of a piezoelectric crystal material, the piezoelectric crystal material comprising a Langasite crystal or a Langatate crystal;
- measuring temperature of the fluid with the sensor, wherein the measuring the temperature of the fluid with the sensor includes estimating resistivity of an excitation electrode of the double-ended tuning fork resonator; and
- using the measured temperature to perform temperature compensation on the measured pressure.

14. The method of claim 13, wherein the measuring the temperature of the fluid with the sensor includes measuring the temperature with a resistance temperature detector of the sensor.

15. The method of claim 14, wherein the measuring the temperature of the fluid with the resistance temperature detector of the sensor includes measuring the temperature with a wire mounted on a substrate that includes the double-ended tuning fork resonator.

16. The method of claim 13, wherein the measuring the temperature of the fluid with the sensor includes measuring the temperature with an additional resonator integrated into a substrate that includes the double-ended tuning fork resonator.

* * * * *